US009813045B2

(12) United States Patent
Jin

(10) Patent No.: US 9,813,045 B2
(45) Date of Patent: Nov. 7, 2017

(54) PRECISION FREQUENCY MONITOR

(71) Applicant: MICROSEMI SEMICONDUCTOR ULC, Kanata (CA)

(72) Inventor: Qu Gary Jin, Kanata (CA)

(73) Assignee: Microseni Semiconductor ULC, Kanata (CA)

( * ) Notice: Subject to any disclaimer, the term of this patent is extended or adjusted under 35 U.S.C. 154(b) by 162 days.

(21) Appl. No.: 14/848,403

(22) Filed: Sep. 9, 2015

(65) Prior Publication Data

US 2016/0079961 A1    Mar. 17, 2016

Related U.S. Application Data

(60) Provisional application No. 62/051,368, filed on Sep. 17, 2014.

(51) Int. Cl.
*G01R 23/02*    (2006.01)
*H03H 21/00*    (2006.01)

(52) U.S. Cl.
CPC ......... *H03H 21/0012* (2013.01); *G01R 23/02* (2013.01)

(58) Field of Classification Search
CPC ..... G01R 23/02; G01R 23/165; H03H 17/026
USPC ........................................................ 708/309
See application file for complete search history.

(56) References Cited

U.S. PATENT DOCUMENTS

2002/0072343 A1* 6/2002 Miyatani ............. H04B 7/0848
                                                        455/272
2006/0092905 A1* 5/2006 Do ....................... H04B 17/336
                                                        370/342

FOREIGN PATENT DOCUMENTS

JP            08331475 A  * 12/1996  ............... H04N 5/46

* cited by examiner

*Primary Examiner* — Chuong D Ngo
(74) *Attorney, Agent, or Firm* — Thomas Horstemeyer, LLP

(57)    ABSTRACT

A precision frequency monitor provides a precision frequency monitor value (PFM) indicative of the precision of the frequency or period of an input reference signal. A first averaging module is responsive to the input reference signal to find an average frequency or period during successive predetermined time periods defining operational cycles. A second averaging module is responsive to an output of the first averaging module to average the output of the first averaging module over N operational cycles, where N is an integer, and output an updated PFM value every N operational cycles. An infinite impulse response (IIR) filter is responsive to the output of the first averaging module to filter the output of the first averaging module to output interim updated PFM values within each sequence of N operational cycles.

18 Claims, 2 Drawing Sheets

US 9,813,045 B2

PRECISION FREQUENCY MONITOR

CROSS REFERENCE TO RELATED APPLICATION

This application claims the benefit under 35 USC 119(e) of prior U.S. provisional application No. 62/051,368 filed Sep. 17, 2014.

FIELD OF THE INVENTION

This invention relates generally to the field of precision timing circuits, and in particular to a precision frequency monitor for use with a phase locked loop.

BACKGROUND OF THE INVENTION

Phase locked loops (PLLs) are employed to derive a precision output signal by locking on to an input reference signal. However, before the reference signal can be applied to a PLL, it is oftentimes first necessary to determine whether the reference signal meets certain stability criteria, both as to jitter and wander. Jitter refers to short-term phase variations in the signal, whereas wander refers to gradual phase shifts occurring over longer periods. The process of determining whether a reference signal meets the stability criteria is known as precision frequency monitoring (PFM). A reference signal is consider qualified if it meets the stability criteria and disqualified if it does not. These decisions have to be made with a high degree of accuracy because it is important not to allow a PLL to lock on to an unstable or incorrect clock frequency, for example, resulting from drift of a crystal oscillator.

A typical implementation is shown in FIG. 1. The reference clock (Clock in) is applied to a signal period estimation module 10, which provides an estimate of the signal period to a short-term averaging module 12. The short-term averaging module 12 obtains an average of the provided estimated period over a time period, T, which in typical embodiment is one second. The short-term averaging module 12 thus provides one output sample representing the estimated period every second. The resulting average $T_x$ is passed through the low pass filter 14 to provide the PFM output signal. It will be appreciated that in an alternative embodiment the short-term averaging module may obtain an average of the frequency from the provided estimated period.

The PFM output signal is then compared with the desired period, or frequency, to determine whether the difference between the PFM output signal and the desired period, or frequency, lies within a predetermined qualification range. If yes, the signal is qualified; otherwise it is disqualified.

The design of the low pass filter 14 is an important consideration. To obtain an accurate measurement, a narrow band low pass filter is required to remove jitter. In the prior art a finite impulse response (FIR) filter whose register is periodically refreshed is employed because a FIR filter can rapidly respond to an input frequency change. An infinite impulse response (IIR) filter, while simpler to implement, is too slow to react to input frequency changes to offer high precision PFM.

The FIR filter is however the main bottleneck in a high precision PFM. A typical N-tap FIR filter is shown in FIG. 2. This comprises a chain of N unit delay registers, which are added together with equal weights. If a high precision long-term average is required, a large number of unit delay registers are required. For an N-tap FIR filter, the memory flush time is constant (N seconds) because a sample arrives every second and it thus takes N seconds for a data sample to pass through the filter. The memory flush time determines the amount of time that it takes for all the samples which contribute to the output to reflect the changed input. This arrangement guarantees a PFM value will be available N seconds after start-up. The PFM value will then be updated every second. However, such a FIR filter can be too complex and expensive to implement. Also, the performance of the FIR filter is limited by the number of taps N. Its frequency estimation accuracy increases from 0 to N seconds as the memory fills up upon the arrival of successive samples after start-up and then can never be improved, since after N seconds all the samples in memory reflect the changed input.

SUMMARY OF THE INVENTION

According to the present invention there is provided a precision frequency monitor for providing a precision frequency monitor value (PPM) indicative of the precision of the frequency or period of an input reference signal, comprising a first averaging module responsive to the input reference signal to find an average frequency or period during successive predetermined time periods defining operational cycles; a second averaging module responsive to an output of the first averaging module to average the output of the first averaging module over N operational cycles, where N is an integer, and output an updated PFM value every N operational cycles; and an infinite impulse response (IIR) filter responsive to the output of the first averaging module to filter the output of the first averaging module to output interim updated PFM values within each sequence of N operational cycles.

In a non-limiting exemplary embodiment the second averaging module may be provided by an N-tap FIR filter that accumulates input data over N cycles followed by a downsampler to find the average value over N operation cycles. Alternatively, the second averaging module may be implemented by single-tap accumulation block comprising an adder and unit delay with a reset control and sampling gate followed by a divider by N.

In another embodiment the output of the second averaging block may be inhibited when the PFM values meet certain threshold noise criteria. In this case the PFM output values are provided by the IIR filter until the noise threshold limits are exceeded.

According to another aspect of the invention there is provided a method of monitoring the precision in frequency of an input reference signal, comprising averaging the input reference signal to find an average frequency or period during successive predetermined time periods defining operational cycles; averaging said average frequency or period over N operational cycles, where N is an integer, to find an average precision frequency monitor value (PFM) and outputting an updated PFM value every N operational cycles; and filtering the average frequency or period with an infinite impulse response (IIR) filter to output interim updated PFM values within each sequence of N operational cycles.

BRIEF DESCRIPTION OF THE DRAWINGS

The invention will now be described in more detail, by way of example only, with reference to the accompanying drawings, in which:—

DETAILED DESCRIPTION OF EMBODIMENTS OF THE INVENTION

Figure 1:
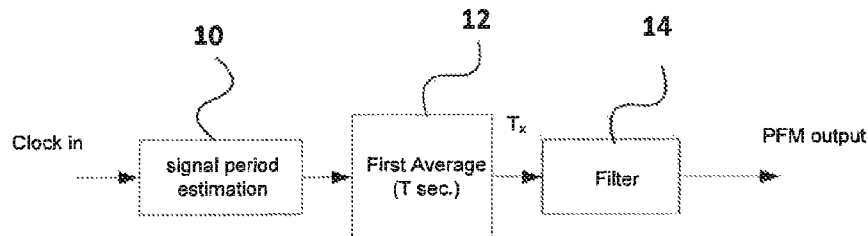
FIG. 1 is a block diagram of a prior art PFM monitor.
Figure 2:
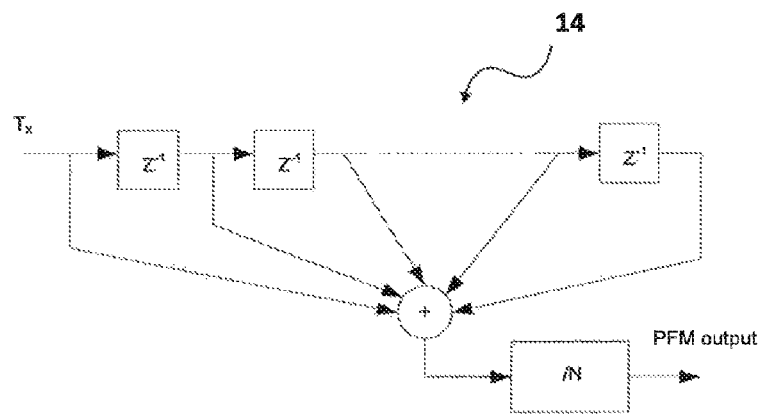
FIG. 2 is a block diagram of a prior art FIR filter.

One solution to the problem of using a FIR filter would be to replace the N-tap FIR filter shown in FIG. 1 with a module performing a block averaging operation wherein the averaging block is arranged to provide an average output every N*T seconds. This solution would reduce the circuit complexity, but the problem with such a solution is that the PFM output would only be updated every N*T seconds instead of every second as is the case with a FIR filter.

Figure 3:
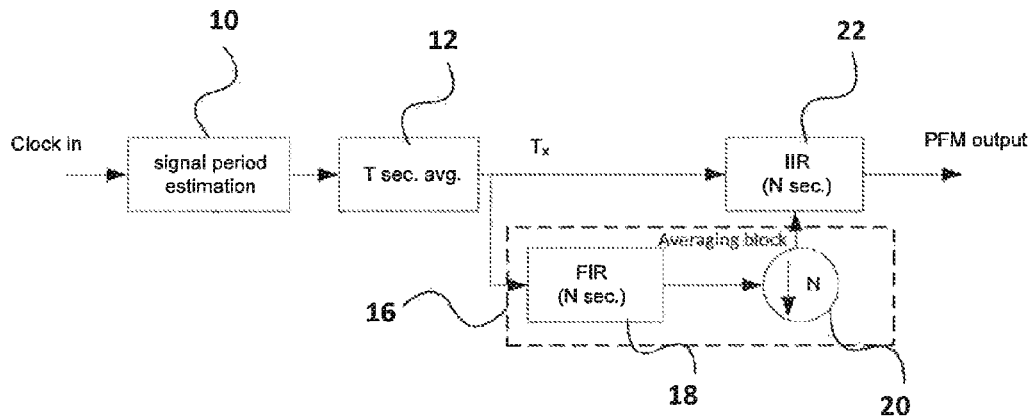
FIG. 3 is a block diagram of a first embodiment of a PFM according to the invention.

In the embodiment shown in FIG. 3, it is assumed that the circuit is implemented within a processor or hardware that is clocked by a system clock running at a certain rate. The reference clock (Clock in) is passed through the signal period estimation module 10, whose output is passed to first averaging module 12. Every T seconds the averaging module 12 outputs the average period, or frequency, of the reference clock over T seconds, which in this exemplary embodiment is one second. The period T defines an operation cycle of the precision frequency monitor. In this embodiment the averaging module 12 outputs a data value Tx every second. This output Tx is passed to block 16 comprising N-tap FIR filter 18 and downsampler 20 (Downsampling occurs when a digital signal comprising a sequence of samples is resampled by a factor N to reduce the effective sampling rate) and to an equivalent N-second IIR filter 22. The IIR filter 22 is a single pole filter with the same equivalent bandwidth $\alpha=(N-1)/N$ as the FIR filter 18.

The output of the downsampler 20 provides updated PFM values every N operation cycles, or every N seconds assuming T=one second. The block 16 is equivalent to an averaging block that averages over N operation cycles.

The IIR filter 22 provides updated PFM values on each operation cycle. The IIR filter memory is updated by the FIR filter 18 output every N operation cycles. Furthermore, when the output of the downsampler 20 is present, it is switched to be the PFM output. During the remainder of the time the output the IIR filter 4 is provided as the PFM output.

The IIR filter 22 overcomes the limitations of the averaging operation by providing interim updates between the updates derived from the averaging block 16.

Figure 4:
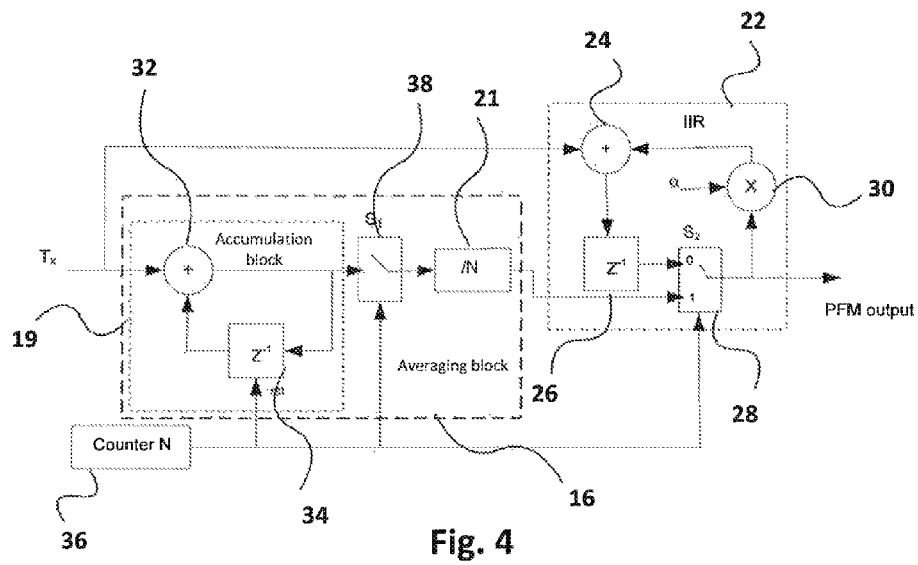
FIG. 4 is a block diagram of a second embodiment of a PFM according to the invention.

An exemplary low cost implementation of this embodiment is shown in FIG. 4. The IIR filter 22 comprises adder 24, unit delay 26, switch 28, and multiplier 30 with a first input provided by the output of switch 28, i.e. the PFM output, and a second input receiving a constant value $\alpha$, which is the equivalent bandwidth of the IIR filter 22.

Instead of the N-tap FIR filter followed by the downsampler 20, this embodiment employs a single tap accumulation block 19 comprising adder 32 and unit delay module 34. The unit delay module 34 is reset every N operation cycles by modulo N counter 36, which counts each operation cycle. The reset signal rst, which occurs when the counter 36 reaches its maximum count N, also sets the switch 38, which is normally in the open position, of one operation cycle to the closed position to send the output of the accumulation block 19 to the divide-by-N divider 21.

The reset signal rst, also sets the switch or sampling gate 28, which is normally in the 0 position to obtain the delayed PFM output from the IIR filter 22, to the 1 position to obtain the PFM output from the divider 21. This arrangement ensures the PFM output is obtained from the averaging block 16 comprising the accumulation block 19, the sampling gate 38, and divider 21 every N seconds and from the IIR filter 22 during the interim operation cycles.

In the meantime, the unit delay module 34, is reset to zero for the next cycle and the counter 36 is restarted. During the normal operation (when the value in the counter 34 is less than N), the accumulation block 19 acts a simple summation block and the IIR filter 22 acts a normal single pole IIR filter with Tx as its input.

This described method can be implemented at low cost and outputs PFM values on each operation cycle with the required average precision that meets the qualify and disqualify time.

Figure 5:
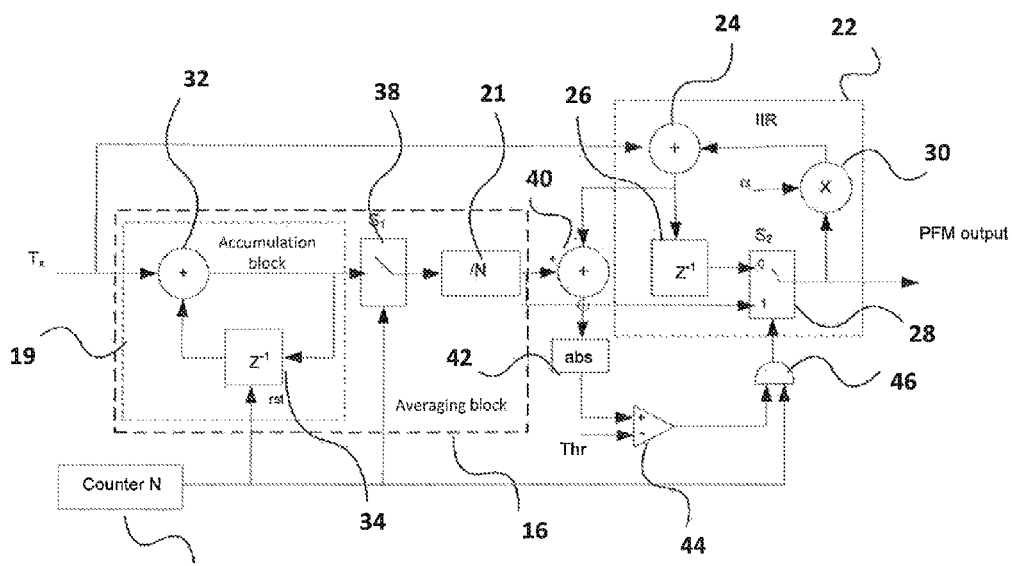
FIG. 5 is block diagram of a third embodiment of a PFM according to the invention.

The embodiment shown in FIG. 5 may be employed if further precision is required for the PFM output. In this embodiment, the IIR filter 22 can have a much lower bandwidth than the average block 16. This filter does not require updating by the average block 16 when the input clock is stable so that the PFM accuracy can be improved over a long time after reference has been qualified. This IIR filter 22 will remove more jitter noise from the input reference.

This embodiment includes additional adder 40, absolute value module 42, threshold comparator 44, and AND gate 46 acting as a decision block. The output of adder 24 is herein additionally fed to a subtraction input of adder 40 and the output of divider 21 is fed to an additional input of adder 40. The output of adder 40 passes through absolute value module 42 whose output is presented to the non-inverting input of comparator 44. A reference signal Thr is fed the inverting input of comparator 44, and the output of comparator 44 is fed to a first input of AND gate 46, and the output of counter 36 is additionally fed to a second input of AND gate 46. The output of AND gate 46 controls the operation of switch 28.

When the input reference (Clock in) has a fast frequency drift, the decision block 46 enables operation as described above in relation to FIG. 4. When the input reference (Clock in) has a slow frequency drift, the decision block 46 prevents the output of FIR filter 18 from both appearing at the PFM output and being factored into IIR filter 22, as will be described further below.

When the count value of counter 36 reaches N, and thus signal rst is asserted, if the difference between the average block 16 output and the IIR filter 22 output is in a predefined noise threshold range, as determined by the set threshold, i.e. by signal Thr, the output of comparator 44 is negative, and thus the asserted signal rst does not pass through AND gate 46 to change the state of switch 28. The PFM output precision is thus determined by IIR filter 22 and unrelated to the average block 16. When the count value of counter 36 reaches N, if this difference is greater than the noise threshold, the cause must be drifting of the input frequency. At that moment, the output of AND gate 46 sets switch 28 to pass the output of FIR filter to the PFM output through switch 28, and appears as an input at multiplier 30, ultimately impacting unit delay 26, which acts as the memory for IIR filter 22.

This embodiment provides a much more accurate ongoing continuous PFM measurement while the PFM qualification and disqualification times meet the requirements.

Most parameter selections are based on the requirements of a particular application. In general, the pre-measurement time defining the operational cycle T is 1 sec. The FIR filter parameter N is determined by PFM qualification and disqualification time. The parameters for IIR filter in FIG. 3 are also determined by the formula N ($\alpha=(N-1)/N$). The IIR filter bandwidth in FIG. 5 is determined by input jitter attenuation requirement.

The IIR filter is a first order filter with pole at I–$\alpha$ Hz. If I–$\alpha$=10, the pole is at 0.1 Hz and the filter gives a 3 dB attenuation for 10 Hz jitter.

The noise threshold is set as the maximum jitter magnitude at the FIR filter output. It will depend on the reference clock quality. The threshold should preferably be much smaller than the PFM qualify-disqualify range.

Embodiments of the invention thus provide a novel architecture for a low cost PFM circuit suitable for PLL applications. The novel architecture can meet the required PFM qualification/disqualification time for practical applications and maintain the PFM precision using low cost circuitry. Unlike the prior art there is no need to make a trade off between PFM precision and the qualification/disqualification time. The circuit is simple to implement compared to prior art PFM circuitry.

The multi-bandwidth filter combination architecture is flexible and useful for applications requiring both fast tracking and a stable PFM output. The combined FIR/IIR architecture can have both quick filter response time and a stable output value with low bandwidth.

It will be understood that the invention is not limited to the use of two filters (one FIR and one IIR filter). It can be further extended to a multiple bandwidth filter combination architecture using more than two filters to benefit both response time and output stability.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A precision frequency monitor for providing a precision frequency monitor (PFM) output value indicative of the precision of the frequency or period of an input reference signal, comprising:

an averaging module responsive to an average signal $T_x$ representing an average frequency or period of said input reference signal during successive predetermined time periods defining operational cycles, said averaging module being operative to average said average signal $T_x$ over N operational cycles, where N is an integer, and provide an updated PFM value every N operational cycles;

an infinite impulse response (IIR) filter operative to filter said average signal $T_x$ to generate interim PFM values;

a modulo N counter generating a reset signal every N operational cycles to prompt said averaging module to output said updated PFM value;

said IIR filter including an output switch operative to select said interim PFM values within each sequence of N operational cycles as said PFM output value, and said updated PFM value in response to said reset signal; and said IIR filter further receiving as a feedback input said PFM output value.

2. A precision frequency monitor as claimed in claim 1, wherein the IIR filter comprises a one pole filter.

3. A precision frequency monitor as claimed in claim 1, wherein the averaging module comprises an adder with a unit delay register in a feedback loop followed by a divider-by-N module.

4. A precision frequency monitor as claimed in claim 3, wherein said modulo N counter resets said unit delay register every N cycles.

5. A precision frequency monitor as claimed in claim 4, further comprising a further switch responsive to said reset signal to send the output of the said adder to the divider-by-N module.

6. A precision frequency monitor as claimed in claim 5, wherein said output switch receives a first input from the IIR filter and a second input from the divider-by-N, said output switch being configured to normally output the PFM value from the IIR filter and to output the PFM value from the divider-by-N in response to reset said signal.

7. A precision frequency monitor as claimed in claim 6, wherein the IIR filter comprises a unit delay register in a feedback loop including a multiplier by a constant value $\alpha$.

8. A precision frequency monitor as claimed in claim 1, further comprising a disabling module for preventing said reset signal from being applied to said output switch when the input reference signal meets a predetermined stability criterion.

9. A precision frequency monitor as claimed in claim 8, wherein the disabling module comprises a comparator for comparing the updated PFM values with the interim PFM values, and a threshold detector for determining when the difference between PFM values is less than a predetermined threshold.

10. A precision frequency monitor as claimed in claim 9, wherein said disabling module further comprises an AND gate receiving as a first input the output of said threshold detector and as a second input said reset signal.

11. A method of monitoring the precision in frequency of an input reference signal in a precision frequency monitor (PFM) comprising: an averaging module responsive to an average signal $T_x$ representing an average frequency or period of said input reference signal during successive predetermined time periods defining operational cycles; an infinite impulse response (IIR) filter including an output switch operative to select alternative inputs as PFM output values; and a modulo N counter generating a reset signal every N operational cycles; said method comprising:

averaging said average signal $T_x$ over N operational cycles, where N is an integer, to find an updated precision frequency monitor value (PFM) every N operational cycles;

generating said updated PFM value every N operational cycles;

filtering said average signal $T_x$ with said infinite impulse response (IIR) filter to generate interim PFM values within each sequence of N operational cycles;

operating said output switch to select to select as said PFM output values, said interim PFM values within each sequence of N operational cycles and said updated PFM value in response to said reset signal; and feeding back said output PFM values to said IIR filter.

12. A method as claimed in claim 11, wherein said average signal $T_x$ is filtered with a one pole IIR filter.

13. A method as claimed in claim 11, wherein said averaging said average signal $T_x$ is performed by an adder with a unit delay register in a feedback loop followed by a divider-by-N.

14. A method as claimed in claim 13, further wherein said reset signal resets said unit delay register every N cycles.

15. A method as claimed in claim 14, wherein the output of the adder is sent to the divider-by-N every N clock cycles.

16. A method as claimed in claim 15, wherein said output switch couples the output of said divider-by-N to an output of said precision frequency monitor in response to said reset signal.

17. A method as claimed in claim 11, wherein said reset signal is inhibited from reaching said output switch when the input reference signal meets a predetermined stability criterion.

18. A method as claimed in claim 17, wherein the updated PFM values are compared with the interim PFM values, and said reset signal is inhibited from reaching said output switch when the difference between updated PFM values and said interim PFM values is less than a predetermined threshold.

* * * * *